United States Patent
Wu et al.

(10) Patent No.: US 9,941,261 B2
(45) Date of Patent: Apr. 10, 2018

(54) DISPLAY DEVICE

(71) Applicant: InnoLux Corporation, Miao-Li County (TW)

(72) Inventors: Cheng-Min Wu, Miao-Li County (TW); Chien-Feng Shih, Miao-Li County (TW); Sheng-Feng Huang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 391 days.

(21) Appl. No.: 14/863,618

(22) Filed: Sep. 24, 2015

(65) Prior Publication Data

US 2016/0118370 A1 Apr. 28, 2016

(30) Foreign Application Priority Data

Oct. 27, 2014 (TW) .............................. 103136969 A

(51) Int. Cl.
| H01L 51/52 | (2006.01) |
| H01L 25/16 | (2006.01) |
| H01L 27/32 | (2006.01) |
| G02F 1/1345 | (2006.01) |

(52) U.S. Cl.
CPC ........ *H01L 25/167* (2013.01); *G02F 1/13452* (2013.01); *H01L 27/3232* (2013.01); *H01L 51/52* (2013.01); *H01L 51/524* (2013.01); *G02F 2201/56* (2013.01); *H01L 27/3276* (2013.01); *H01L 51/5281* (2013.01); *H01L 2924/0002* (2013.01)

(58) Field of Classification Search
CPC ..... H01L 25/167; H01L 51/524; H01L 51/52; H01L 27/3232; H01L 2924/0002; H01L 27/3276; H01L 51/5281; G02F 1/13452; G02F 2201/56
See application file for complete search history.

(56) References Cited

U.S. PATENT DOCUMENTS

| 8,717,306 | B2 | 5/2014 | Choi et al. | |
| 2009/0195721 | A1* | 8/2009 | Tanahara | G02F 1/136213 349/39 |
| 2010/0020277 | A1* | 1/2010 | Morita | G02F 1/133512 349/110 |

(Continued)

FOREIGN PATENT DOCUMENTS

| CN | 103049130 A | 4/2013 |
| CN | 102419931 B | 9/2013 |

(Continued)

*Primary Examiner* — Donald Raleigh
(74) *Attorney, Agent, or Firm* — Bacon & Thomas, PLLC

(57) ABSTRACT

A display device is disclosed, which comprises: a first substrate; a second substrate disposed adjacent to the first substrate and partially covering the first substrate, wherein the second substrate comprises a second arc edge and a second side, and the second arc edge connects to the second side; a driving unit disposed on a part of the first substrate uncovered with the second substrate; and a compensation panel disposed on the driving unit and comprising a third arc edge and a third side, wherein the third arc edge connects to the third side, wherein the third side corresponds to the second side, and the third arc edge corresponds to the second arc edge.

10 Claims, 4 Drawing Sheets

(56) References Cited

U.S. PATENT DOCUMENTS

| | | | |
|---|---|---|---|
| 2010/0134743 A1* | 6/2010 | Shin | G02F 1/13 |
| | | | 349/143 |
| 2013/0002133 A1* | 1/2013 | Jin | G09F 9/33 |
| | | | 313/511 |
| 2015/0156867 A1* | 6/2015 | Kim | G02F 1/13452 |
| | | | 361/767 |
| 2016/0113106 A1* | 4/2016 | Kim | H05K 1/028 |
| | | | 361/749 |
| 2016/0161781 A1* | 6/2016 | Chiu | G02F 1/13306 |
| | | | 349/33 |
| 2016/0210893 A1* | 7/2016 | Lee | G09G 3/2092 |

FOREIGN PATENT DOCUMENTS

| | | |
|---|---|---|
| JP | 2010277099 A | 12/2010 |
| TW | 201135697 A | 10/2011 |
| TW | 201327513 A | 7/2013 |
| WO | 2013021926 A1 | 2/2013 |

\* cited by examiner

DISPLAY DEVICE

CROSS REFERENCE TO RELATED APPLICATION

This application claims the benefits of the Taiwan Patent Application Serial Number 103136969, filed on Oct. 27, 2014, the subject matter of which is incorporated herein by reference.

BACKGROUND OF THE INVENTION

1. Field of the Invention

The present invention relates to a display device and, more particularly, to a display device having a free shape display region.

2. Description of Related Art

In recent years, all the display devices are developed toward having small volume, thin thickness and light weight as the display techniques progresses. A liquid crystal display (LCD) device is a flat panel display device with a thin thickness, so a conventional cathode ray tube (CRT) display is gradually replaced by the LCD device. Especially, the LCD device can be applied to various fields. For example, the daily used devices such as cell phones, notebooks, video cameras, cameras, music players, navigation devices, and televisions are equipped with liquid crystal display (LCD) panels.

Most of the common display devices have rectangular shapes. Recently, to meet the requirement for beautiful and creative display devices, many display devices having different free structures such as circular, triangle and diamond structures are provided. Additionally, as the development of the wearable display devices such as watches which are usually have circular shapes, it is necessary to design free shape display devices.

However, for the conventional display panels of display devices, even though the display panels can have arc edges through a free-shape cutting process, the dispositions of the driving units still limit the display regions thereof. Thus, the display regions of the display panels cannot present desirable circular, ellipse or other circle-like shape, and the requirements of the consumers cannot be achieved.

Therefore, it is desirable to provide a display device with a display region close to a complete free shape, to meet the customers' requirements for display.

SUMMARY OF THE INVENTION

The object of the present invention is to provide a display device with a compensation panel to achieve the purpose of providing a display device with a free shape display region.

To achieve the object, the display device of the present invention comprises: a first substrate; a second substrate disposed adjacent to the first substrate and partially covering the first substrate, wherein the second substrate comprises a second arc edge and a second side, and the second arc edge connects to the second side; a driving unit disposed on a part of the first substrate uncovered with the second substrate; and a compensation panel disposed on the driving unit and comprising a third arc edge and a third side, wherein the third arc edge connects to the third side. Herein, the third side corresponds to the second side, and the third arc edge corresponds to the second arc edge.

In the present invention, a compensation panel is comprised in the display device, wherein the third side of the compensation panel corresponds to the second side of the second substrate, and the third arc edge of the compensation panel corresponds to the second arc edge of the second substrate. Hence, the display regions of the compensation panel of the second substrate can combine together to form a display region to be close to a circular display region, accomplishing the purpose of a free shape display device.

Other objects, advantages, and novel features of the invention will become more apparent from the following detailed description when taken in conjunction with the accompanying drawings.

DETAILED DESCRIPTION OF THE PREFERRED EMBODIMENT

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Figure 1A:
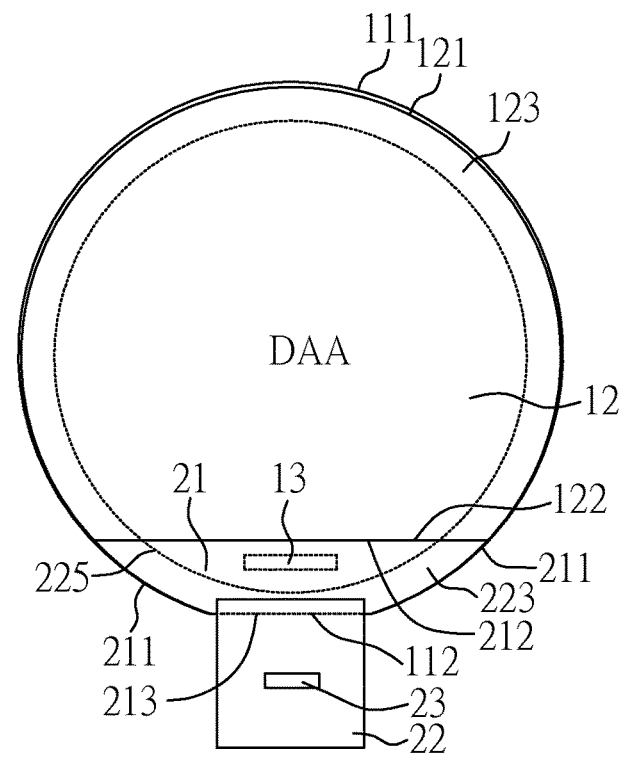
FIG. 1A is a top view of a display device according to a preferred embodiment of the present invention.
Figure 2:
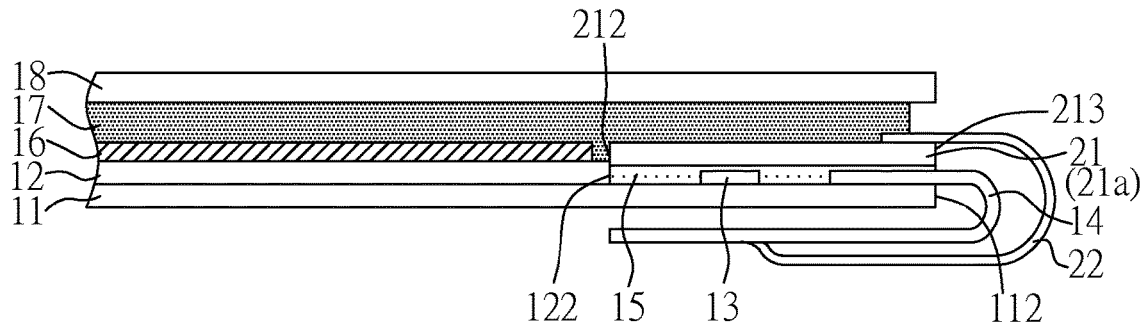
FIG. 2 is a cross-sectional view of a display device according to a preferred embodiment of the present invention.

FIGS. 1A and 2 are respectively a top view and a cross-sectional view of a free shape display device according to one preferred embodiment of the present invention.

As shown in FIGS. 1A and 2, in the process for preparing the display device of the present embodiment, a first substrate 11 is provided, which is a free-shape substrate obtained through a free-shape cutting process. The term "free shape substrate" used herein refers a substrate with an outline not a regular polygon (wherein the number of the edges thereof is larger than 3), an ellipse or a circle generally known in the art, and refers to a substrate with an irregular outline. For example, the free shape substrate can be a substrate wherein partial edges are cut into arcs, or a circular substrate with a protrusion. In other embodiment of the present invention, the first substrate 11 is not limited to the free-shape substrate, and can be a circular or ellipse substrate. The first substrate 11 can be a glass substrate, a metal substrate, a plastic substrate, a polymer-composite substrate, or a combination thereof. The thickness of the first substrate 11 can be in a range from 0.01 mm to 1.5 mm. Preferably, the first substrate 11 is a glass substrate or a metal substrate with a thickness of 0.01 mm to 0.3 mm.

In the present embodiment, the first substrate 11 has a first arc edge 111 and a first side 112, two ends of the first arc edge 111 respectively connects to two ends of the first side 112. Herein, the first arc edge 111 determines the major outline of the display device, and the linear first side 112 is the side with driving circuits corresponding thereto. However, in other embodiment of the present invention, the first substrate 11 may have other shapes. For example, the first substrate 11 may has a protrusion near to the first side 112. That is, there are linking edges between the ends of the first side 112 and the ends of the first arc edge 111, wherein the linking edges can be curved edges or linear edges (which is not shown in the figure, but may be referred to the shape of the compensation panel shown in FIG. 1B). Herein, the first substrate 11 can be a thin film transistor (TFT) substrate generally used in the art, and plural TFT units (not shown in the figure) are formed thereon. The semiconductor material used in these TFT units can be amorphous silicon (a-Si), low temperature poly-silicon (LTPS), or metal oxide semiconductors such as IGZO. In addition, electrodes, driving circuits or organic light emitting diodes (OLEDs) may also be formed on the first substrate 11. The first substrate 11 as the TFT substrate may have a central pixel area as a display area and a peripheral area surrounding the central pixel area; and TFT units, passive units and driving circuits may be formed on both the central pixel area and the peripheral area.

In addition, as shown in FIG. 2, a driving unit is disposed on the peripheral area adjacent to the first side 112 of the first substrate 11, which comprises a driving chip 13 and a first flexible circuit board 14. In the present embodiment, the driving chip 13 is relatively close to the display area, the first flexible circuit board 14 is relatively close to the first side 112, a part of the first flexible circuit board 14 connects to the circuits on peripheral area of the first substrate 11, and the rest part of the first flexible circuit board 14 is bent to cover the first side 112 or a backside of the first substrate 11 and connects to a main circuit board. Herein, the driving unit can be designed to have a chip on glass (COG) structure comprising an integrated circuit chip (IC) coupled with a flexible print circuit (FPC), as shown in the present embodiment. In other embodiment of the present invention, the driving chip 13 and the first flexible circuit board 14 can be integrated into an IC-integrated flexible circuit package. For example, a chip on film (COF) or a tap carrier package (TCP) can be used in the present invention, wherein an insulating adhesive layer 15 is selectively used to mount the driving chip 13 and the first flexible circuit board 14 on the first substrate 11 during packaging process of the driving unit. However, in other embodiment of the present invention, the adhesive layer 15 can be replaced with a fixing film.

Next, as shown in FIGS. 1A and 2, a second substrate 12 is proved, which is also a free-shape substrate obtained through a free-shape cutting process. In the present embodiment, the second substrate 12 comprises a second arc edge 121 and a second side 122, and two ends of the second arc edge 121 connects to two ends of the second side 122. The second side 122 is linear from the top view and corresponds to the first side 112. Preferably, an area of the second substrate 12 is smaller than that of the first substrate 11. In other embodiment, the area of the second substrate 12 may be slightly larger than that of the first substrate 11.

In the present embodiment, the first substrate 11 and the second substrate 12 have similar shapes. However, in other embodiment of the present invention, the first substrate 11 and the second substrate 12 can have different shapes. For example, the second substrate 12 may has a protrusion near to the second side 122. That is, there are linking edges between the ends of the second side 122 and the ends of the second arc edge 121, wherein the linking edges can be arc edges or linear edges (which is not shown in the figure, but may be referred to the shape of the compensation panel shown in FIG. 1B). The second substrate 12 can be a glass substrate, a metal substrate, a plastic substrate, a polymer-composite substrate, or a combination thereof. The thickness of the second substrate 12 can be in a range from 0.01 mm to 1.5 mm. Preferably, the second substrate 12 is a glass substrate or a metal substrate with a thickness of 0.01 mm to 0.3 mm.

As shown in FIGS. 1A and 2, the second substrate 12 can be a color filter substrate generally used in the art, which has a color filter layer (not shown in the figure) and a shielding layer 123 such a black matrix layer. The shielding layer 123 covers the peripheral area to expose the display region DAA having a circle-like shape. In the present embodiment, the shielding layer 123 has an arc structure corresponding to the second arc edge 121, wherein two ends thereof correspond to two ends of the second side 122. However, in other embodiment of the present invention, the shielding layer 123 may also has a linear portion corresponding to the second side 122. In addition, the shielding layer 123 may cover a sealing member (not shown in the figure) locating between the first substrate 11 and the second substrate 12. A color filter layer (not shown in the figure) may also be selectively disposed on the first substrate 11 as the TFT substrate. The second substrate 12 can be a touch panel generally used in the art, which is disposed with touch electrodes and driving circuits thereof. Alternatively, in the case that the display device is an OLED device, the second substrate 12 can be used as a protection substrate to prevent the OLED units on the first substrate 11 being deteriorated by moisture and gas. In the present embodiment, the first arc edge 111 is set to be corresponded to the second arc edge 121 during the assembling process, wherein these two edges may be aligned to each other or there is a distance therebetween (from the top view). If there is a distance d between the first side 112 and the second side 122 (wherein the distance d is a width of a region for circuit binding) from the top view, the distance between the first arc edge 111 and the second arc edge 121 may be in a range from 0 to d. Preferably, the distance between the first arc edge 111 and the second arc edge 121 is substantially 0.

Figure 5:
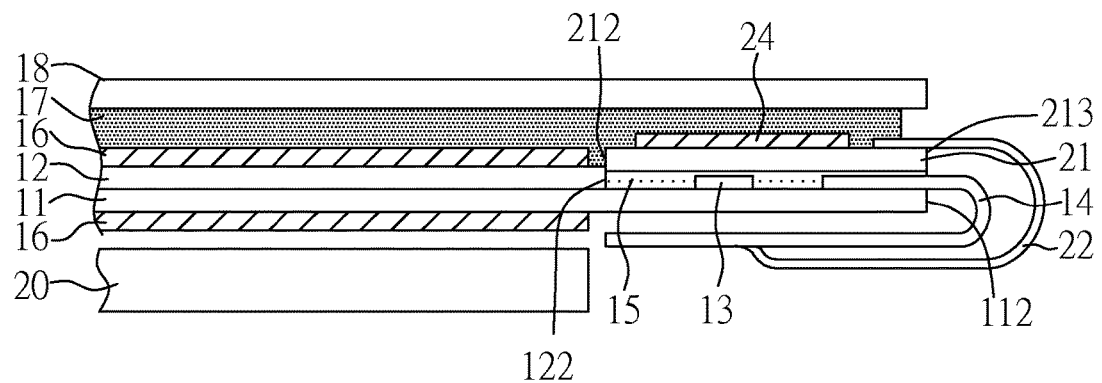
FIG. 5 is a cross-sectional view of a display device according to another preferred embodiment of the present invention.

Next, as shown in FIG. 2, after assembling the first substrate 11 and the second substrate 12 and laminating a polarizer 16 on the second substrate 12, a display panel of the present embodiment can be obtained. In one case that the display panel is a liquid crystal display (LCD) panel, as shown in FIG. 5, another polarizer 16 is further disposed on a side of the first substrate 11 opposite to a side thereof facing to the second substrate 12, and a backlight module 20 is further disposed on a backside of the display panel. In another case that the display panel is an OLED display panel, only one polarizer 16 is comprised therein, or the polarizer 16 can be removed. The thickness of the polarizer 16 can be in a range from 0.01 mm to 1.5 mm; and preferably, the polarizer 16 being a circular polarizer has a thickness ranging from 0.05 mm to 0.25 mm. In the present embodiment, a liquid crystal layer (not shown in the figure), alignment layers (not shown in the figure) and a frame (a kind of a sealant layer, not shown in the figure) are disposed between the first substrate 11 and the second substrate 12; therefore, the display panel of the present embodiment is a LCD panel. However, in other embodiment of the present invention, OLED units (not shown in the figure) and a fit sealant (a kind of a sealant layer, not shown in the figure) can be disposed between the first substrate 11 and the second substrate 12; therefore, the display panel of the present embodiment is an OLED display panel.

In the aforementioned process, the first substrate 11 and the second substrate 12 having free shapes are provided in advance and assembled to each other. However, in other embodiment of the present invention, uncut mother substrates are provided in advance and assembled to each other, followed by cutting through a free-shape cutting process to obtain the first substrate 11 and the second substrate 12 having free shapes.

Figure 1B:
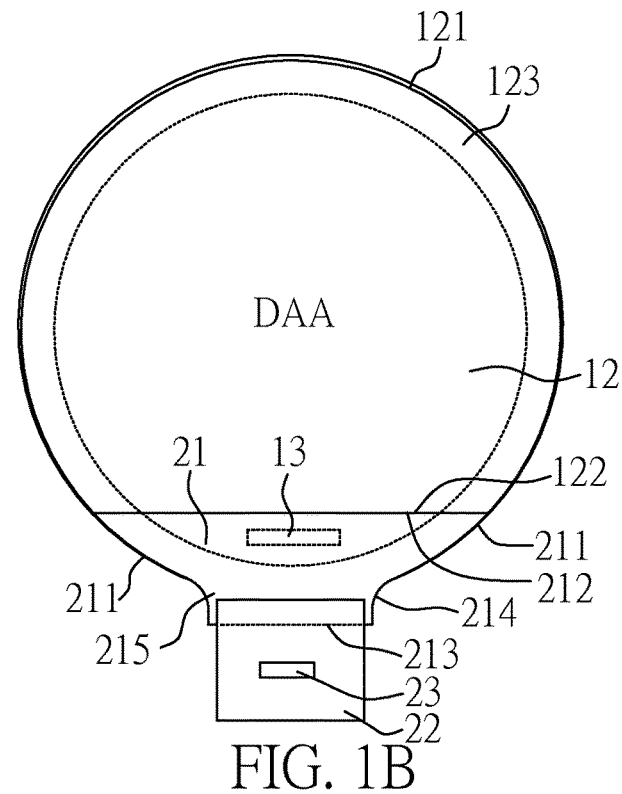
FIG. 1B is a top view of a display device according to another preferred embodiment of the present invention.
Figure 3:
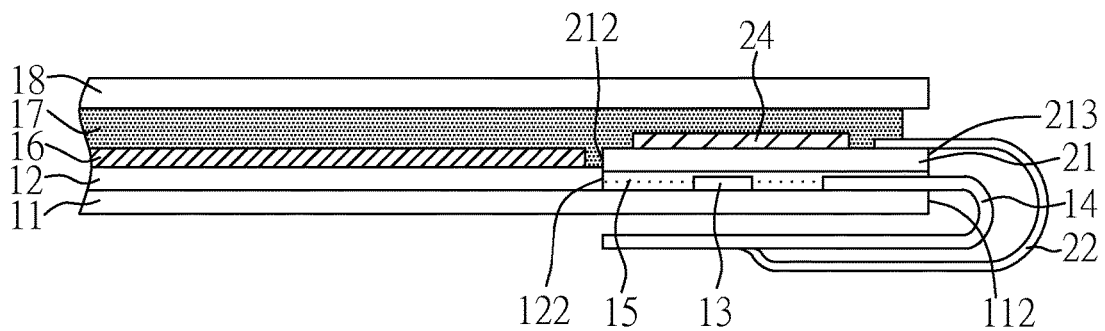
FIG. 3 is a cross-sectional view of a display device according to another preferred embodiment of the present invention.

As shown in FIGS. 1A, 2 and 3, after assembling the first substrate 11 and the second substrate 12 to obtain the display panel, a compensation panel 21 is assembled on the first substrate 11 at the region with the driving chip 13 of the driving unit formed thereon and uncovered with the second substrate 12. Hence, an outline of the display region can be close to a circle. The compensation panel 21 comprises two third arc edges 211, a third side 212 and a fourth side 213, wherein ends of each third arc edges 211 respectively connects to ends of the third side 212 and the fourth side 213 to obtain a free shape structure. As shown in FIG. 1A, in the present embodiment, the third side 212 and the fourth side 213 are linear, the third side 212 corresponds to the second side 122, and the fourth side 213 corresponds to the first side 112. As shown in FIG. 1B, in other embodiment, the compensation panel 21 has a protrusion, wherein linking edges 214 locate between the third arc edges 211 and the fourth side 213. The linking edges 214 can be curved edges or linear edges, and the outlines of the linking edges 214 are different from those of the third arc edges 211, the third side 212 and the fourth side 213.

Figure 4:
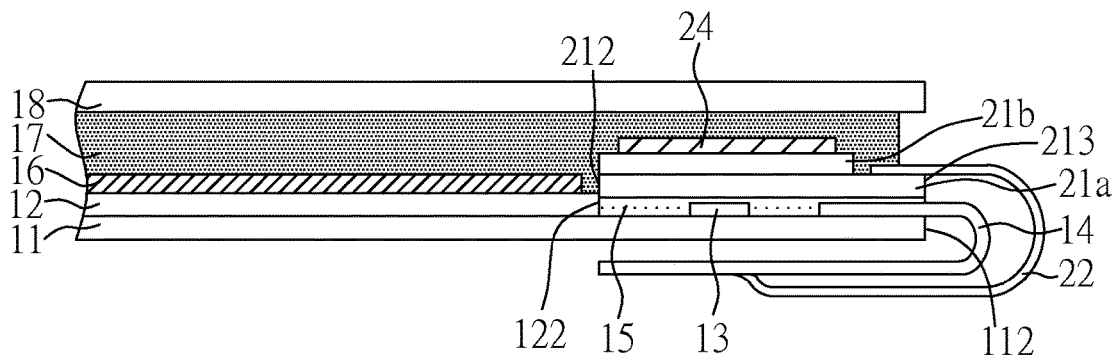
FIG. 4 is a cross-sectional view of a display device according to another preferred embodiment of the present invention.

As shown in FIGS. 1A and 2, the compensation panel 21 further comprises a third substrate 21a having optical or electric structures such as TFT units, driving circuits, display units or a shielding layer 223. The compensation panel 21 has a display region DAA defined by an inner edge 225 of the shielding layer 223. Similar to the second substrate 12, the shielding layer 223 can have an arc structure or a linear structure near to the third side 212, and the circuit package is covered by the shielding layer 223. Preferably, the display units on the compensation panel 21 is OLED units, wherein a protection layer with organic layers and inorganic layers are laminated alternately to prevent the damages by moisture and gas. The material for the third substrate 21a can be identical to the display panel, which can be a glass substrate, a plastic substrate or other polymer substrate. Additionally, the thickness thereof is also similar to those illustrated above. In addition, the compensation panel 21 may also be an electro-phoretic display (EPD) panel or a reflective plate. As shown in FIGS. 3 to 6, another polarizer 24 may further be adhered on an upper surface of the compensation panel 21 or a lower surface (not shown in the figure) thereof. In the present embodiment, the compensation panel 21 is an OLED display panel, so the polarizer 24 is adhered on the upper surface thereof to reduce the light reflectance of environmental light which may cause display contrast decreased. As shown in FIG. 4, the compensation panel 21 may comprise a fourth substrate 21b partially covering the surface of the third substrate 21a, wherein a sealant layer such as a fit sealant is disposed between the fourth substrate 21b and the third substrate 21a to provide protection and barrier of moisture and gas. The material and the thickness of the fourth substrate 21b are similar to those of other substrates illustrated above. Preferably, thicknesses of the third substrate 21a and the fourth substrate 21b may be smaller than those of the first substrate 11 and the second substrate 12 to reduce the overall thickness of the whole display device. In this case, the polarizer 24 locates on the upper surface of the fourth substrate 21b.

In addition, a driving unit may also be disposed on a side near to the fourth side 213 of the compensation panel 21, which comprises a second flexible circuit board 22 corresponding to the first flexible circuit board 14 and is bended to the backside of the first substrate 11. The second flexible circuit board 22 and the first flexible circuit board 14 both electrically connect to the main circuit board. As shown in FIGS. 1A, 1B and 2, the second flexible circuit board 22 in the driving unit of the present embodiment can be an IC-integrated flexible circuit package having a flexible print circuit (FPC) coupled with a driving chip 23. For example, a chip on film (COF) or a tap carrier package (TCP) can be used in the present invention. In other embodiment, the driving unit on the compensation panel 21 can be designed to have a chip on glass (COG) structure, as those on the first substrate 11. Similarly, an insulating adhesive or a fixing film can be used to mount the second flexible circuit board 22.

Figure 6:
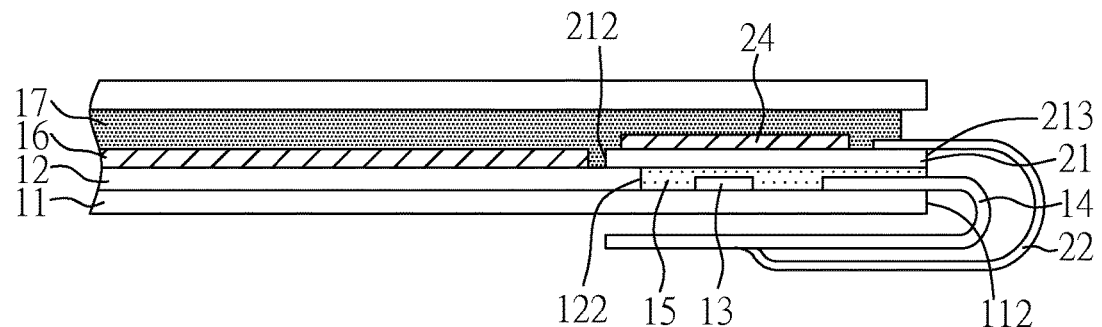
FIG. 6 is a cross-sectional view of a display device according to another preferred embodiment of the present invention.

As shown in FIGS. 2 to 5, the third side 212 of the compensation panel 21 is adjacent to the second side 122 of the second substrate 12, and apart from the polarizer 16 in a gap. There are also gaps between the polarizer 24 on the compensation panel 21 and the third side 212 thereof, and between the polarizer 24 and the fourth side 213 thereof. As shown in FIG. 6, the third side 212 of the compensation panel 21 crossed over the second side 122 of the second substrate 12, there is a distance between the third side 212 and the second side 122, and the third side 212 locates between the second side 122 and the polarizer 16.

Figure 7A:
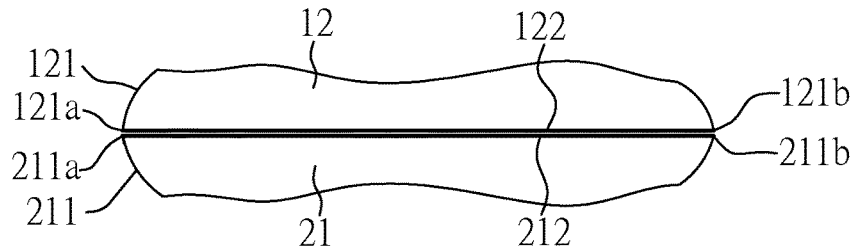
FIG. 7A is a top view of a display device according to another preferred embodiment of the present invention.
Figure 7B:
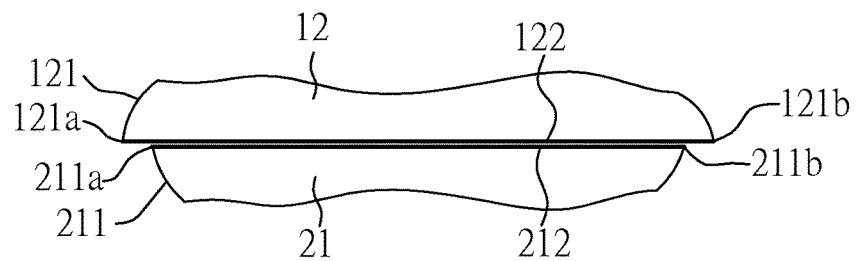
FIG. 7B is a top view of a display device according to another preferred embodiment of the present invention.
Figure 7C:
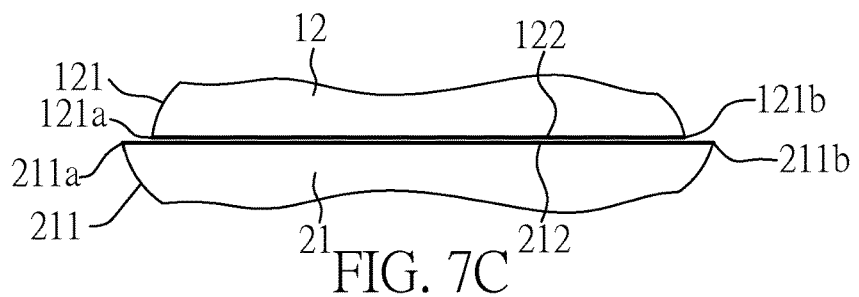
FIG. 7C is a top view of a display device according to another preferred embodiment of the present invention.
Figure 7D:
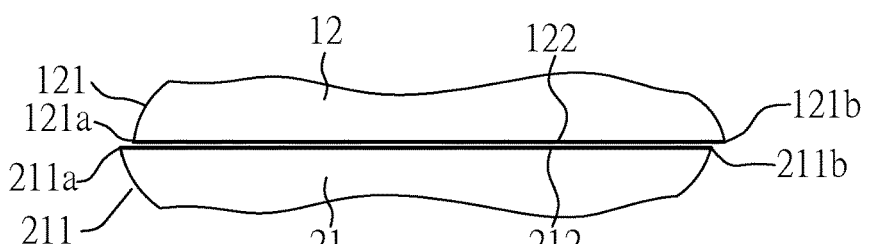
FIG. 7D is a top view of a display device according to another preferred embodiment of the present invention.
Figure 7E:
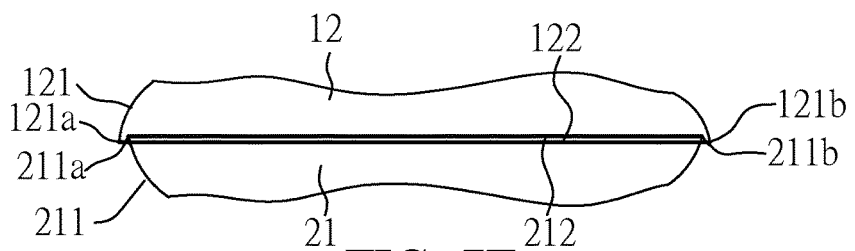
FIG. 7E is a top view of a display device according to another preferred embodiment of the present invention.

FIGS. 7A to 7E show the corresponding relation between the second substrate and the compensation panel of the present invention indicated above. The second arc edge 121 has two ends 121a, 121b, and the third arc edges 211 has two ends 211a, 211b, wherein the end 121a is adjacent to and even overlapped with the end 211a, and the end 121b is also adjacent to and even overlapped with the end 211b. The second side 122 is adjacent to the third side 212, and lengths thereof are almost the same. In addition, the third side 212 of the compensation panel 21 may also cross over the second side 122 of the second substrate 12, so the compensation panel 21 partially covers the second substrate 12, as shown in FIG. 7E.

Finally, as shown in FIGS. 2 to 6, an adhesive layer 17 and an outer substrate 18 are further laminated on the second substrate 12 and the compensation panel 21 to accomplish the circular display panel of the present embodiment. In the present embodiment, the adhesive layer 17 can be made of any adhesive with high transmittance generally used in the art, such as adhesive layer 17 (OCA) or optical clear resin (OCR). The disposed adhesive layer 17 can fill the gaps between the compensation panel 21 and the polarizer 16, and also level steps between the second substrate 12, the compensation panel 21, and the polarizers 16, 24, to flatten the display device. The outer substrate 18 can be a pressureresistant, scratch-proof and corrosion-resistant cover glass (CG), and may also have tough sensors formed thereon.

After the aforementioned process, a free shape display device of the present embodiment can be obtained, which comprises the display panel and the compensation panel 21 assembled with each other. Through the disposition of the provided compensation panel 21, the compensation panel 21 and the second substrate 12 together can form a display region or an outline substantially close to a complete free shape. In addition, the compensation panel 21 can display a specific pattern, to solve the problem that the region outside the second substrate 12 cannot emit light. Hence, a complete free shape image can be presented to meet the requirement of forming circular display region.

In addition, the display device provided by the aforementioned embodiments of the present invention can be applied to any electronic device for displaying images, such as a mobile phone, a notebook, a camera, a video camera, a music player, a navigation system, or a television.

Although the present invention has been explained in relation to its preferred embodiment, it is to be understood that many other possible modifications and variations can be made without departing from the spirit and scope of the invention as hereinafter claimed.

What is claimed is:

1. A display device, comprising:
   a first substrate;
   a second substrate disposed adjacent to the first substrate and partially covering the first substrate, wherein the second substrate comprises a second arc edge and a second side, and the second arc edge connects to the second side;
   a driving unit disposed on a part of the first substrate uncovered with the second substrate; and
   a compensation panel disposed on the driving unit and comprising a third arc edge and a third side, wherein the third arc edge connects to the third side,
   wherein the third side corresponds to the second side, and the third arc edge corresponds to the second arc edge.

2. The display device as claimed in claim 1, wherein the driving unit comprises a driving chip and a first flexible circuit board, wherein the first flexible circuit board is disposed to be corresponded to a first side of the first substrate, and the driving chip locates between the second substrate and the first flexible circuit board.

3. The display device as claimed in claim 1, further comprising a first polarizer, a second polarizer and a backlight module, wherein the second substrate locates between the first substrate and the first polarizer, wherein the first substrate and the second substrate locate between the first polarizer and the second polarizer, and the first substrate locates between the backlight module and the compensation panel.

4. The display device as claimed in claim 2, wherein the first substrate further comprises plural linking edges and a first arc edge, the linking edges locate between the first arc edge and the first side, and the first arc edge and the first side connect to the linking edges.

5. The display device as claimed in claim 1, wherein the compensation panel further comprises a fourth side and plural linking edges, the linking edges locate between the third arc edge and the fourth side, and the third arc edge and the fourth side connect to the linking edges.

6. The display device as claimed in claim 1, wherein the compensation panel partially overlaps with the second substrate.

7. The display device as claimed in claim 1, wherein an area of the second substrate is larger than that of the compensation panel.

8. The display device as claimed in claim 1, wherein the compensation panel further comprises a third substrate and a fourth substrate, wherein the third substrate locates between the first substrate and the fourth substrate, and an area of the third substrate is larger than that of the fourth substrate.

9. The display device as claimed in claim 8, wherein the compensation panel further comprises a polarizer, and the fourth substrate locates between the polarizer and the third substrate.

10. The display device as claimed in claim 1, wherein the compensation panel is an organic light emitting diode display panel.

* * * * *